SEMICONDUCTOR FABRICATION METHOD FOR ACCOMMODATING REDUNDANCY

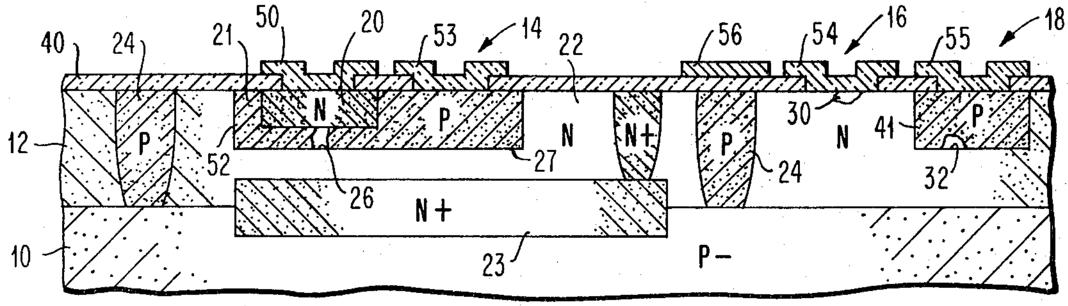
FIG. 1
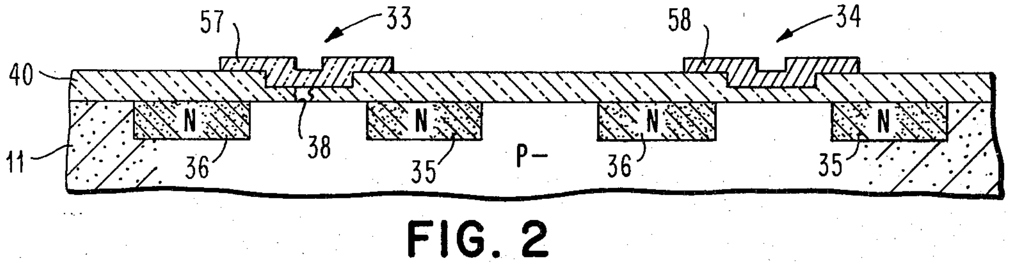
FIG. 2
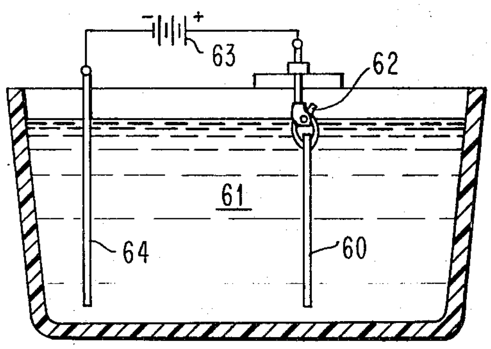
FIG. 3
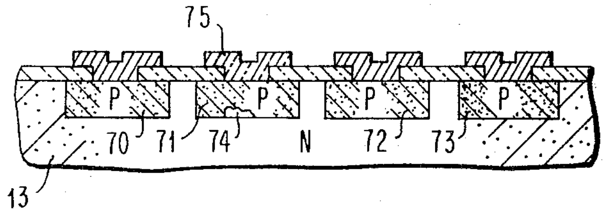
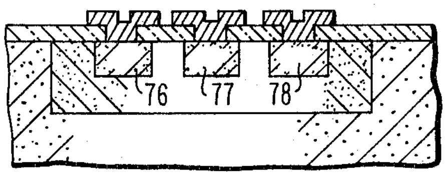
FIG. 4A FIG. 4B 3,846,259

Bernard F. Duncan, Fishkill, and David K. Seto, La Grangeville, N.Y., assignors to International Business Machines Corporation, Armonk, N.Y.

Filed Oct. 18, 1973, Ser. No. 407,732
Int. Cl. C23b *5/48*, H01l *7/00*
U.S. Cl. 204—15 11 Claims

ABSTRACT OF THE DISCLOSURE

A fabrication method for utilizing semiconductor substrates that potentially embody defective active and passive device elements and/or isolation structural defects. The method entails depositing a blanket layer of an anodizable metal over a substrate body having embodied therein a plurality of transistor devices, an overlying insulating layer, and contact openings through the layer exposing regions defined by PN junctions, forming the metal layer into discrete sections over regions of the device to be tested including contact openings, immersing the body in an electrolyte solution, impressing a voltage across the semiconductor body and solution to make the body an anode, removing the body from the electrolyte, sealing the anodized portion, removing the unanodized metal sections, leaving the anodized metal areas intact, and forming an interconnection metallurgy pattern on the surface of the body connecting the active and passive device elements of the body into operative circuits.

BACKGROUND OF THE INVENTION

The present invention relates to improvements in the manufacture of integrated circuit semiconductor devices and, more particularly, to a method that seals off and also indicates defective discrete devices on the body so that they can be identified, and also electrically isolates same from a subsequent interconnection metallurgy system.

In the fabrication of modern microminiaturized semiconductor devices, many masking and subtractive etching steps are required. The masking operation requires a very precise alignment of masks, where the geometry of the masks is so small that it must be aligned under high magnification. Many technical problems are encountered, as for example, a small speck of dust on the wafer or the mask creates an unwanted image. Also, small projections on the surface of the wafer can scratch the mask rendering it useless for further operations. Many diffusions are also made where time and temperature must be closely controlled to provide closely spaced vertical junctions necessary to obtain the desired high device reaction times and consistent gain factors. In addition to the aforedescribed manipulative fabrication process steps that have the effect of reducing the yield of good devices, the condition of the crystal lattice of the semiconductor wafer and the epitaxial layer can also affect yield. A lattice defect in a critical location will produce a short resulting in a bad device, even though the process steps are performed flawlessly. For example, semiconductor dopants introduced during a diffusion, diffuse at a faster rate in dislocations, i.e. crystal defects. This results in a "spike" configuration in the diffused region. When this "spike" contacts or passes through an adjacent PN junction, a short occurs. One bad transistor, or shorted element, on a device embodying hundreds and possibly thousands of active and passive device elements renders the entire circuit array useless.

The concept of redundancy has been proposed, which would permit the utilization of devices having a few bad elements. This concept entails detecting defective elements on the device at an appropriate time in the fabrication process, isolating the bad devices and using the remaining good elements in appropriate circuits. This practice normally depends on tailoring the metallurgy pattern to avoid the defective elements, or masking out the elements by conventional masking tailored to each device and making suitable accommodations to take into account the device deficiency. This requires tedious, time-consuming tailoring operations which to the present were not economically feasible. However, as the devices become smaller and more expensive with greater circuit densities, such expedients become more attractive.

SUMMARY OF THE INVENTION

A principal object of the present invention is to provide a technique for introducing redundancy in the fabrication of semiconductor devices.

Another object of this invention is to provide a method for detecting the presence of defective elements in a semiconductor device prior to fabrication of the interconnection metallurgy system, seal off the defective elements to permit the utilization of conventional pattern metallurgy system to be deposited thereon.

Yet another object of this invention is to provide a method of detecting and sealing off leaky areas of a passivating insulating layer on a semiconductor device.

These and other objects are attained in the device fabrication method performed on semiconductor substrates that potentially embody individual defective active and passive device elements, and dielectric layer structure defects, which substrate includes a plurality of transistor devices, an overlying insulating layer, and contact openings through the layer exposing regions defined by PN junctions. The method involves depositing a blanket layer of anodizable metal over the passivating layer, forming the layer into discrete sections over the regions of the device to be tested, immersing at least the surface of the body embodying the passivating layer and metal layer to an electrolyte solution, impressing a voltage across the semiconductor body and solution to make the body an anode, removing the body from the electrolyte, determining whether or not metal layer sections have been anodized, which anodization indicates isolation failure of the associated element and/or the passivating layer, removing the unanodized metal regions, and depositing an interconnection metallurgy system on the resultant substrate.

BRIEF DESCRIPTION OF THE DRAWING

The foregoing and other objects, features and advantages of the invention will be apparent from the following more particular description of preferred embodiments of the invention as illustrated in the accompanying drawings.

FIG. 1 is an elevational view in broken section of a typical integrated circuit semiconductor device illustrating the nature of the defects which can be detected and sealed off by the method of the invention.

FIG. 2 is an elevational view in broken section illustrating how the method of the invention can be used to detect and seal isolation layer defects.

FIG. 3 is a cross-sectional view illustrating the apparatus for anodizing semiconductor devices in accordance with the process of the invention.

FIGS. 4A and 4B are elevational views in broken section of semiconductor devices illustrating typical techniques for introducing redundancy into integrated circuit semiconductor devices.

DESCRIPTION OF PREFERRED EMBODIMENTS

Figure 5:
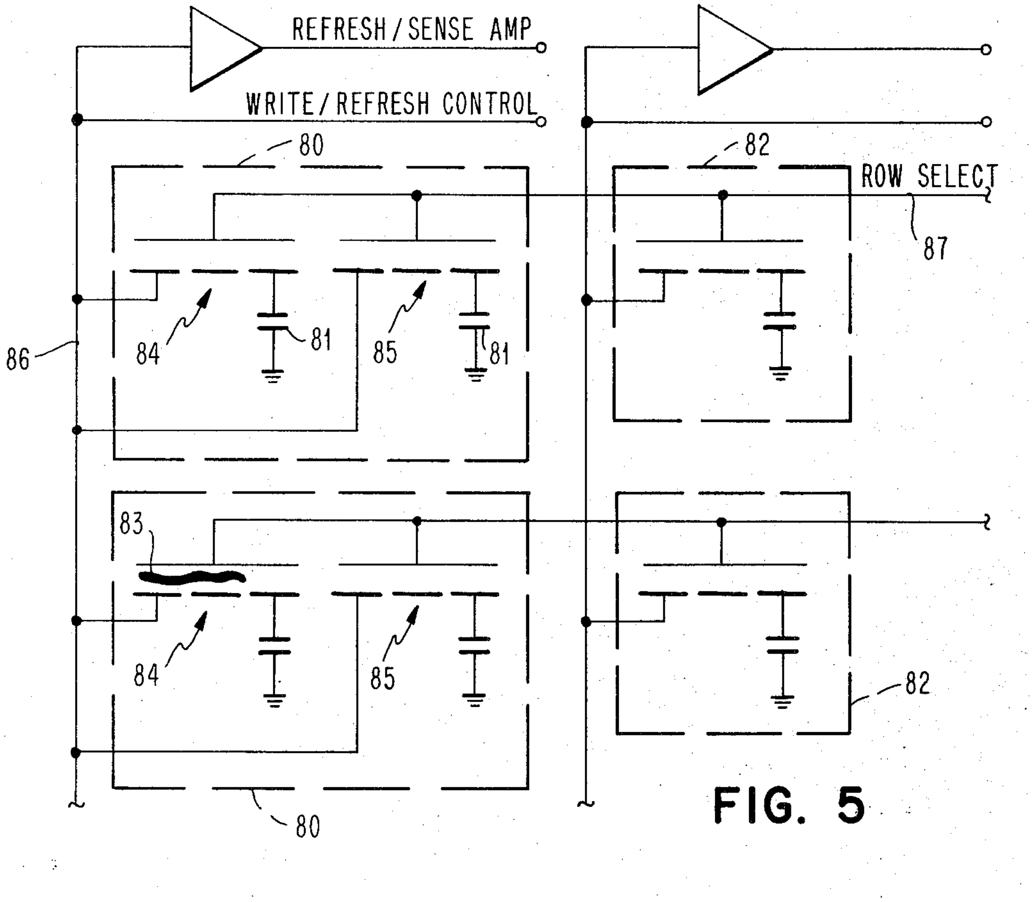
FIG. 5 is a schematic diagram of a one transistor dynamic random access memory cell in an abbreviated matrix illustrating yet another technique for accommodating the redundancy.

Microminiaturization has significantly reduced the size geometry of integrated circuit semiconductor devices. A factor that significantly influences yield of semiconductor devices is the quality of the monocrystalline semiconductor substrate, which in turn influences the quality of the epitaxial layer normally deposited on the substrate during fabrication of the devices. With the present small device geometry, a crystal lattice defect in a critical region can cause shorting across PN junctions in the device. For example, semiconductor impurities diffused from the surface of the device during fabrication will diffuse along a defect or fault in the semiconductor lattice at a faster rate than in adjacent perfect crystal lattice structure. The more rapid diffusion rate will cause a spike-like configuration in the PN junction which may contact or cross an adjacent closely spaced junction. The shorting is most prevalent in bi-polar devices beneath the emitter region, since the base and emitter junctions are closely spaced. This results in a short. A shorted transistor in an integrated circuit device necessitates rejection of the entire circuit array, even though the transistor is a very small part thereof. The trend toward greater microminiaturization in integrated circuit devices will increase the aforementioned problem.

An effort to overcome this problem, that is utilizing device structure having one or more imperfect elements thereon, has been made. One solution is to employ what is termed "redundancy." In this general concept, an effort is made to by-pass or tailor the device metallurgy to avoid using the defective elements on the device. To the present, this entailed tedious and time-consuming testing and metallurgy interconnection structure tailored to perform this function.

Referring now to FIG. 1, there is depicted typical integrated circuit device structure consisting of a base substrate 10, an epitaxial layer 12, a transistor 14, a Schottky barrier device 16, and a diode 18 embodied therein. Transistor 14 has an emitter region 20, a base region 21, a collector region 22, and a sub-collector region 23. Isolation structure, typically a diffused region 24, surrounds device 14 and extends into the device to contact the PN junction between the substrate 10 and epitaxial layer 12. Transistor 14 is shown with a defect 26 consisting of a spike configuration on emitter 20 which extends to the collector base PN junction 27. This spike 26 causes a short between the emitter and the collector resulting in a non-operative transistor. Schottky barrier diode 16 has indicated thereon a surface defect 30 causing it to break down under back-biasing conditions. Likewise, diode 18 has indicated therein a defect 32 in the PN junction that acts as a short across the junction. As will be explained hereinafter, the method of this invention makes possible the utilization of an integrated circuit containing defective devices of the nature illustrated in FIG. 1.

Referring now to FIG. 2, there is illustrated a pair of field effect transistors 33 and 34 on substrate 11 each provided with source and drain regions 35 and 36. A critical aspect of field effect transistors is the quality of the gate insulation separating the gate electrode from the gate region of the device. It is desirable that the gate insulation be thin in order to obtain a relatively low operating threshold voltage. However, the thinner the oxide the more probability that it will break down in operation. In this process, the quality of the gate insulation can be tested. An imperfect layer having an opening and/or leakage path as indicated by 38 in field effect transistor 33 would result in a short between substrate 11 and an overlying conductive gate electrode.

In the method of the invention, the device having the complete internal structure in place is covered with a passivating layer 40 typically of $SiO_2$, a composite layer of $Si_3N_4$ over $SiO_2$, or other insulating layers known to the prior art.

Figure 6:
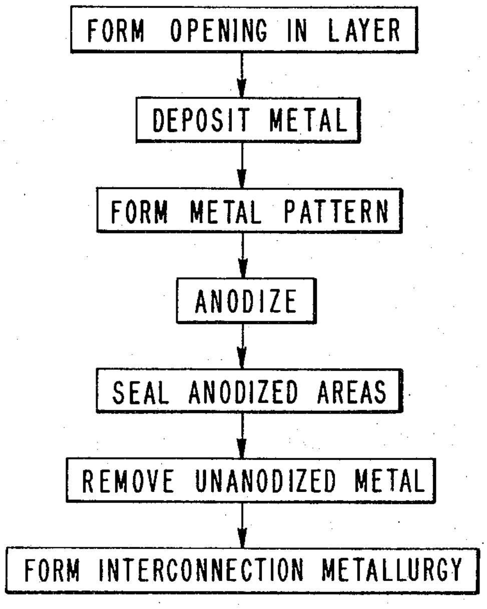
FIG. 6 is a block diagram illustrating the basic process steps of the method of the invention.

As indicated in FIG. 6, in the first step of the process openings are made in the layer to expose the appropriate regions within the device which regions are electrically isolated from the substrate 10 by a back-biased PN junction. As shown in FIG. 1, openings are made to the emitter region 20, to the base region 21, to the Schottky interface 16, and the region 41 of diode 18. In the illustration shown in FIG. 2, the gate dielectric layers have previously been formed to their final dimensions. After forming the openings to the contact regions, a blanket layer of an anodizable metal is deposited on the surface of the wafer. Metals that are anodizable are typically aluminum, niobium, zirconium, tungsten, tantalum, and the like. The metal layer is then formed into discrete areas over the appropriate contact openings, gate regions, and areas where the quality of the passivating layer covering the semiconductor is to be tested. As shown in FIG. 1, region 50 over the emitter region 20 is fabricated as a separate region. When the wafer is immersed in a suitable electrolyte and a positive potential applied to the back side of the wafer, the collector base PN junction 52 is back-biased. The emitter base junction, and the collector substrate PN junction are forward biased and therefore provide no opposition to the flow of current through the wafer. When a defect is present, as for example defect 26 shown in FIG. 1 across the base collector junction, current flows from the back side of the wafer through the wafer to the aluminum region 50, or through region 53 in contact with base region 21, which causes the metal to be anodized. This causes the metal to be oxidized forming an insulating layer. When regions 50 and 53 are aluminum, $Al_2O_3$ is formed which is an insulating layer. An oxide layer will also be formed in regions 54 and 55 when defects 30 and 32 are present, which cause shorting or leakage across the junctions. Region 56 deposited over passivating layer 40 would also be anodized when and if an opening or defect occurs between the epitaxial layer and the region. In like manner, as shown in FIG. 2, the region 57 of metal is anodized when a short occurs between the substrate and a region, as indicaed by defect 38. When no defects or openings occur in the dielectric layer, the metal region 58 will not be anodized and will remain as the original metal.

The anodization of the wafer is accomplished in an apparatus illustrated schematically in FIG. 3. The wafer 60 is immersed in solution 61 when supported by a suitable clamp 62 connected to the positive terminal of a battery 63. The cathode is an element 64 made of a metal above hydrogen in the electromotive series that is immersed in electrolyte 61. Anode 64 is connected to the negative terminal of battery 63 as indicated. The electrolyte is any suitable type solution that produces a porous oxide on the metal and does not adversely affect the structure of the semiconductor wafer. A preferred solution is a 5–15% aqueous solution of $H_2SO_4$. The voltage applied by battery 63 or other suitable voltage source can be of any suitable voltage for the particular application. Preferably, a voltage of 2–50 volts, more preferably from 2–5 volts is preferred for detecting and isolating internal device defects. A voltage in the range of 2–100 volts is preferred for detecting defects in insulating layers on the surface of the device. The time in the solution can be any suitable time, preferably from 2–60 minutes. In general, the thickness of the anodic oxide is in the range of 60 angstroms to two microns. After the metal regions over defects have been anodized, the resultant oxide layer is sealed to convert the normally porous oxide to a non-porous oxide. In the case of aluminum oxide, this can be accomplished by dipping in hot $H_2O$ or exposing to steam.

As indicated in FIG. 6, after anodizing the wafer, the unanodized metal regions are removed. This can be accomplished by any suitable metal etchant which leaves the anodized portions intact. In the instance of aluminum as the anodizable metal, a preferred etchant is a saturated solution of mercuric chloride in warm water. At the termination of this step, what remains is a semiconductor wafer containing plugs of insulating material, namely metal oxide in the contact openings of the defective devices, and also a thick layer of oxide over the gate regions of the defective field effect transistors, which gate regions are normally thin, and an oxide layer over any leaky passivating layer regions. This effectively seals off the defective regions of the device. In the case of field effect transistors, the thicker oxide layer raises the threshold voltage to a point that makes it essentially inoperative. The defective devices and regions can be observed at this point and, if necessary, a map made of the devices to indicate the defective elements. The interconnection metallurgy system is then formed on the surface of the wafer to complete the integrated circuit devices.

Redundancy can be achieved with the method of the invention by two basic techniques. A first technique illustrated in FIGS. 4A and 4B is to provide separate segments of a single device element, seal the defective segments with the anodized metal plug, and subsequently join all the segments to form the desired element. In FIG. 4A, there is depicted a diode composed of four separate and discrete diffusions 70–73. These diffusions replace one large single diffusion. The anodizable metal layer is broken up into separate regions, and anodized as described previously. In the presence of a defect 74 which causes shorting between diffusion 71 and substrate 13, the metal segment 75 will be converted to the oxide sealing up the defective diffused region. In the interconnection metallurgy system, regions 70, 72 and 73 will be connected in parallel to form a diode.

The same basic idea is illustrated in FIG. 4B wherein elements 76, 77 and 78 are individual, discrete diffusions forming the emitter of a transistor. If a short occurs between the emitter and collector regions, the metal pad contacting the defective region will be anodized, sealing off this particular emitter region. The final metallurgy system will connect for the remaining good emitter regions to form the device.

An extension of the same basic concept is illustrated in FIG. 5 which depicts a plurality of one-transistor dynamic random access memory cells in an abbreviated memory matrix. Each of the cells 80 has two field effect transistors 84 and 85 connected in parallel to the sense and bit lines 86 and 87. In write operation, simultaneous pulses on the sense and bit lines introduce a charge on capacitor 81. Cells 82 illustrate the conventional one transistor cell. In the event that a short occurs in the gate dielectric as indicated by 83 in transistor 84, a thick oxide layer is formed over the gate region which deactivates the field effect transistor by incerasing the threshold voltage. This leaves only the second transistor 85 in cell 80. The memory matrix is designed so that the cells will operate with either one or the other or both transistors. Thus, the presence of a defective gate oxide in one transistor of one cell will not be a fatal defect necessitating discarding the entire matrix. The dual transistor can be used in every cell of the matrix or some percentage of the total number of cells. For example, only fifty percent of the cells in a matrix can utilize the dual transistor or similar idea which would decrease the probability of a defect in the matrix by fifty percent thereby increasing the yield.

Another technique for introducing redundancies, particularly in a memory matrix is to fabricate the anodizable metal pattern in rows and columns such that all of the similar elements in a row or column which are likely to be the source of defects are connected in parallel. Thus, a single defective element will cause the entire metal stripe across one row or column of devices to be anodized, sealing off this row or column. The defect can be observed due to the difference in appearance of anodized and unanodized metal and a map made of the defective matrix, row or column. In use in a computer, the computer is programmed not to utilize this segment or section of the matrix.

While the invention has been particularly shown and described with reference to the preferred embodiments thereof, it will be understod by those skilled in the art that the foregoing and other changes in form and detail may be made therein without departing from the spirit and scope of the invention.

What is claimed is:

1. An integrated circuit semiconductor device fabrication method for utilizing semiconductor substrates that potentially embody defective active and passive devices and isolation structure defects, said substrate including a plurality of transistor devices, an overlying insulating layer, and contact openings through the layer exposing regions defined by a PN junction, the method comprising depositing a blanket layer of an anodizable metal selected from the group consisting of niobium, zirconium, tungsten, tantalum, and aluminum, over said insulating layer, forming said layer of metal into discrete areas over said contact openings, and areas of the insulating layer, immersing at least the surface of the substrate embodying the insulating layer and metal layer to an electrolyte solution, impressing a voltage across the semiconductor substrate and said solution to make the substrate an anode, said voltage applied to back-bias the PN junctions in said substrate in electrical contact with said metal areas, removing the body from the electrolyte solution, removing the un-anodized metal layer areas, and forming an interconnection metallurgy pattern on the surface of said substrate over any remaining anodized metal areas, said anodized areas preventing electrical contact from being formed between said interconnection metallurgy layer and the defective devices and structure in said substrate.

2. The fabrication method of Claim 1 wherein said anodizable metal is aluminum.

3. The fabrication method of Claim 1 wherein said devices are bi-polar transistors and said contact openings are made to expose the emitters of said transistors.

4. The fabrication method of Claim 1 wherein said substrate includes field effect transistor devices, and said discrete sections of anodizable metal include regions located over the gate regions of said transistors.

5. The fabrication method of Claim 1 wherein said substrate includes bi-polar transistor devices, and said contact openings are made to expose the base regions of said transistors.

6. The device fabrication method of Claim 1 wherein said substrates contain memory cells arranged in rows and columns, which cells include transistor devices, said metallurgy layer is formed to provide a common stripe contacting similar device regions in a row or a column.

7. The fabrication method of Claim 1 wherein said substrate body includes parallel elements in circuits wherein the circuit will operate with one or both of said elements, and said interconnection metallurgy pattern is deposited in a circuit configuration and wherein operable circuits result even though a defective region is isolated from the metallurgy pattern by an anodized metal region.

8. The method of Claim 1 wherein the anodized areas of said metal layer are detected and the locations recorded.

9. The fabrication method of Claim 1 wherein the interconnection metallurgy pattern is designed to incorporate functional elements in parallel.

10. The method of Claim 1 wherein said anodized metal areas are made non-porous by exposing to heated $H_2O$.

11. The device structure produced by the method of Claim 1.

References Cited

UNITED STATES PATENTS

| | | | |
|---|---|---|---|
| 3,379,625 | 4/1968 | Csabi | 204—129.3 |
| 3,384,556 | 5/1968 | Rohde | 204—1 T |
| 3,616,284 | 10/1971 | Bodmer | 204—16 |
| 3,738,917 | 6/1973 | Spath | 204—15 |

THOMAS M. TUFARIELLO, Primary Examiner

U.S. Cl. X.R.

29—584